United States Patent
Egan

(10) Patent No.: US 10,855,306 B2
(45) Date of Patent: Dec. 1, 2020

(54) HIGH-SPEED DIGITAL-TO-ANALOG CONVERTER

(71) Applicant: MEDIATEK Singapore Pte. Ltd., Singapore (SG)

(72) Inventor: Nathan Egan, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/533,464

(22) Filed: Aug. 6, 2019

(65) Prior Publication Data
US 2020/0076446 A1 Mar. 5, 2020

Related U.S. Application Data

(60) Provisional application No. 62/724,650, filed on Aug. 30, 2018.

(51) Int. Cl.
*H03M 1/66* (2006.01)
*H03M 1/76* (2006.01)
*H03M 3/00* (2006.01)

(52) U.S. Cl.
CPC ............. *H03M 1/76* (2013.01); *H03M 3/324* (2013.01)

(58) Field of Classification Search
CPC ........ H03M 1/76; H03M 3/324; H03M 1/742; H03M 1/0863; H03M 3/464; H03M 1/66; H03K 3/356165
(Continued)

(56) References Cited

U.S. PATENT DOCUMENTS 5,382,916 A * 1/1995 King .................. H03K 5/15
330/253
5,621,345 A 4/1997 Lee et al.
(Continued)

FOREIGN PATENT DOCUMENTS

EP 0221290 A2 5/1987
EP 0221290 A3 3/1989
(Continued)

OTHER PUBLICATIONS

Bechthum et al., A 5.3GHz 16b 1.75GS/s Wideband RF Mixing-DAC Achieving IMD<-82dBc up to 1.9GHz, IEEE International Solid States Circuits Conference, ISSCC 2015, Session 9, High-Performance Wireless, 9.6, 3 pages.
(Continued)

*Primary Examiner* — Jean B Jeanglaude
(74) *Attorney, Agent, or Firm* — Wolf, Greenfield & Sacks, P.C.

(57) ABSTRACT

A digital-to-analog converter (DAC) capable of operating in radio frequency (RF) with linear output, low distortion, low power consumption, and input data independence. The DAC includes switch drivers and output switches driven by the switch drivers. The switch drivers include pairs of outputs, and positive feedback circuitries coupled between respective pairs of outputs. The output switches are arranged between a first current source configured to push current to the DAC's outputs and a second current source configured to pull current from the DAC's outputs. Different output switches are configured to push current to and pull current from the DAC's outputs in accordance with rising edges and falling edges, respectively.

20 Claims, 8 Drawing Sheets

(58) Field of Classification Search
USPC .......................................................... 341/144
See application file for complete search history.

(56) References Cited

U.S. PATENT DOCUMENTS

| | | | |
|---|---|---|---|
| 6,337,647 | B1 | 1/2002 | Masson et al. |
| 6,621,438 | B1 | 9/2003 | Hong |
| 7,180,432 | B2 | 2/2007 | Oliaei |
| 7,675,996 | B2 | 3/2010 | Johnson et al. |
| 8,401,050 | B1 | 3/2013 | Fudge et al. |
| 8,564,352 | B2* | 10/2013 | Agrawal ............... H04L 27/01 327/231 |
| 8,687,739 | B1 | 4/2014 | Huynh |
| 8,836,560 | B2* | 9/2014 | Felder .................. H03M 1/661 341/144 |
| 9,608,672 | B2 | 3/2017 | Naeini et al. |
| 9,876,489 | B1* | 1/2018 | Casey .................. H03K 5/1515 |
| 2003/0179028 | A1* | 9/2003 | Kizer ....................... G06F 1/10 327/158 |
| 2004/0041604 | A1* | 3/2004 | Kizer ....................... G06F 1/10 327/157 |
| 2005/0225465 | A1 | 10/2005 | Zhang et al. |
| 2008/0025437 | A1 | 1/2008 | Huynh |
| 2010/0283649 | A1 | 11/2010 | Bos et al. |
| 2013/0321709 | A1 | 12/2013 | Daigle et al. |
| 2014/0152479 | A1* | 6/2014 | Felder .................. H03M 1/661 341/144 |
| 2020/0076448 | A1 | 3/2020 | Mitteregger |

FOREIGN PATENT DOCUMENTS

| | | |
|---|---|---|
| EP | 3261258 A1 | 12/2017 |
| EP | 3301813 A1 | 4/2018 |

OTHER PUBLICATIONS

Beilleau et al., A 1.3V 26mW 3.2GS/s Undersampled LC Bandpass ΣΔ ADC for a SDR ISM-band Receiver in 130nm CMOS, 2009 IEEE Radio Frequency Integrated Circuits Symposium, pp. 383-386.

Chalvatzis et al., A 4.5 GHz to 5.8 GHz Tunable ΔΣ Digital Receiver with Q enhancement, IEEE MTT-S International, 2008, pp. 193-196.

Cherry et al., On the Design of a Fourth-Order Continuous-Time LC Delta-Sigma Modulator for UHF A/D Conversion, IEEE Transactions on Circuits and Systems—II: Analog and Digital Signal Processing, vol. 47, No. 6, Jun. 2000, pp. 518-530.

Duncan et al., A 10b DC-to-20GHz Multiple-Return-to-Zero DAC with >48dB SFDR, IEEE International Solid-State Circuits Conference, ISSCC 2017, Session 16, Gigahertz Data Converters, 16.6, 3 pages.

Engel et al., A 14b 3/6 GHz Current-Steering RF DAC in 0.18 μm CMOS with 66dB ACLR at 2.9GHz, IEEE International Solid-State Circuits Conference, ISSCC 2012, Session 27, Data Converter Techniques, 27.1, 3 pages.

Erdmann et al., A 330mW 14b 6.8GS/s Dual-Mode RF DAC in 16nm FinFET Achieving—70.8dBc ACPR in a 20MHz Channel at 5.2GHz, IEEE International Solid-State Circuits Conference, ISSCC 2017, Session 16, Gigahertz Data Converters, 16.3, 3 pages.

Hussein et al., Bandpass ΣΔ Modulator Employing Undersampling and On-Chip Q-Enhanced LC Filter, IEEE, 1999 Southwest Symposium on Mixed Signal Design, pp. 47-51.

Naderi et al., On the Design of Undersampling Continuous-Time Bandpass Delta-Sigma Modulators for Gigahertz Frequency A/D Conversion, IEEE Transactions on Circuits and Systems—I: Regular Papers, vol. 55, No. 11, Dec. 2008, pp. 3488-3499.

Namdar et al., MP 3.7 A 400MHz 12b 18mW IF Digitizer with Mixer Inside a ΣΔ Modulator Loop, IEEE International Solid States Circuits Conference, ISSCC 1999, Session 3, Paper MP 3.7, 3 pages.

Park et al., A Digital-to-Analog Converter Based on Differential-Quad Switching, IEEE Journal of Solid-State Circuits, vol. 37, No. 10, Oct. 2002, pp. 1335-1338.

Ryckaert et al., A 2.4 GHz Low-Power Sixth-Order RF Bandpass ΔΣ Converter in CMOS, IEEE Journal of Solid-State Circuits, vol. 44, No. 11, Nov. 2009, pp. 2873-2880.

Schofield et al., A 16b 400MS/s DAC with <-80dBc IMD to 300MHz and <-160dBm/Hz Noise Power Spectral Density, IEEE International Solid-State Circuits Conference, ISSCC 2003, Session 7, DACs and AMPs, Paper 7.1, 10 pages.

Shibata et al., A DC-to-1 GHz Tunable RF ΔΣ ADC Achieving DR=74 dB and BW—150 MHz at $f_0$-450 MHz Using 550 mW, IEEE Journal of Solid-State Circuits, vol. 47, No. 12, Dec. 2012, pp. 2888-2897.

Spiridon et al., A Linearity Improvement Technique for Overcoming Signal-Dependent Induced Switching Time Mismatch in DAC-Based Transmitters, ESSCIRC Conference 2015, 41st European Solid-State Circuits Conference (ESSCIRC), Sep. 14-18, 2015, pp. 347-347c.

Winoto et al., A Highly Reconfigurable 400-1700MHz Receiver Using a Down-Converting Sigma-Delta A/D with 59-dB SNR and 57-dB SFDR over 4-MHz Bandwidth, 2009 Symposium on VLSI Circuits Digest of Technical Papers, pp. 142-143.

U.S. Appl. No. 16/533,497, filed Aug. 6, 2019, Mitteregger.

Extended European Search Report dated Jan. 20, 2020 in connection with European Application No. 19193421.5.

Extended European Search Report dated Nov. 29, 2019 in connection with European Application No. 19193433.0.

Sowlati et al., Single-chip multiband WCDMA/HSDPA/HSUPA/EGPRS transceiver with diversity receiver and 3G DigRF interface without SAW filters in transmitter / 3G receiver paths, 2009 IEEE International Solid-State Circuits Conference—Digest of Technical Papers, San Francisco, CA, 2009, pp. 116-117,117a.

Tohidian et al., A Fully Integrated Discrete-Time Superheterodyne Receiver, IEEE Transactions on Very Large Scale Integration (VLSI) Systems, vol. 25, No. 2, Feb. 2017, pp. 635-647.

EP 19212305.7, Mar. 3, 2020, Extended European Search Report.

Extended European Search Report dated Mar. 3, 2020 in connection with European Application No. 19212305.7.

* cited by examiner

HIGH-SPEED DIGITAL-TO-ANALOG CONVERTER

RELATED APPLICATIONS

This application claims priority to and the benefit of U.S. Provisional Application Ser. No. 62/724,650, filed Aug. 30, 2018 and titled "DUAL AND TRI LEVEL SWITCH DRIVE FOR D/A CONVERTER FOR NRZ, RZ, RF, AND RFZ OUTPUT MODES," which is hereby incorporated herein by reference in its entirety.

BACKGROUND

This application relates generally to high-speed digital-to-analog converters (DACs), such as those used as feedback DACs of delta-sigma analog-to-digital converters (ADCs).

DACs are used to convert a digital signal to an analog signal. For example, a DAC may be employed to generate a voltage waveform based on a stream of digital values. DACs typically provide an output voltage with a magnitude that corresponds to a magnitude of the received digital value. In particular, the output voltage of a DAC may be proportional to the magnitude of the received digital value.

ADCs are widely used in various electronic apparatus and systems such as mobile phones, audio equipment, image-capture devices, video equipment, communications systems, sensors and measurement equipment, and radar systems, among other applications. A typical ADC is an electronic circuit configured to receive an analog signal, which typically is a time-varying signal, repeatedly sample the analog signal at discrete time intervals, and output a digital signal (e.g., a bit sequence or digital word) for each sampled time interval that is representative of a value of the analog signal during the sampling interval. Because the output of an ADC is an N-bit sequence, the analog signal is discretized into a number $M=2^N$ of integer values. The number N is referred to as the bit resolution of the ADC. For example, if a single-ended ADC is an 8-bit device, then an input signal can be discretized into $2^N=256$ values (0, 1, 2, 3 . . . 255).

Feedback DACs are used in delta-sigma ADCs. In delta modulation, the change in the analog signal is encoded, resulting a stream of pulses. In delta-sigma modulation, accuracy of the modulation is improved by passing the digital output through a feedback DAC and adding the resulting analog signal to the input signal, thereby reducing the error introduced by the delta modulation.

SUMMARY

High-speed digital-to-analog converters (DACs) are provided.

Some embodiments relate to a digital-to-analog converter (DAC) comprising first and second switches; a current source configured to push current to a first output through the first switch based on a first signal and a second output through the second switch based on a second signal; and a switch driver configured to receive a data signal and a clock signal, the switch driver comprising a latch and a positive feedback circuitry, the latch comprising a first output node for the first signal and a second output node for the second signal, the positive feedback circuitry configured to connect the first output node and the second output node.

In some embodiments, the positive feedback circuitry is configured to receive the clock signal such that the latch can be reset.

In some embodiments, the latch is configured to receive the data signal and the clock signal.

In some embodiments, the data signal comprises first and second portions. The latch comprises a third output node configured to output a result of an XOR operation of the first and second portions of the data signal.

In some embodiments, the latch is configured to receive an inverted version of the clock signal. The latch comprises two additional output nodes configured to output based on the inverted version of the clock signal and the first and second signals.

In some embodiments, the switch driver comprises a level shift circuitry configured to shift the voltage levels of the first and second signals such that the first and second switches operate in saturation region.

In some embodiments, the latch is a first latch. The switch driver comprises a second latch between the first latch and the first and second switches.

In some embodiments, the second latch comprises output nodes that are cross-coupled.

In some embodiments, the clock signal is a first clock signal. The second latch is configured to receive a second clock signal. The second clock signal is a delayed version of the first clock signal.

In some embodiments, the first latch comprises transistors of a first-type configured to receive the data signal. The second latch comprises transistors of a second-type configured to receive the first signal and the second signal.

Some embodiments relate to a digital-to-analog converter (DAC) comprising a first current source configured to push current to first and second outputs; a second current source configured to pull current from the first and second outputs; a plurality of switch branches configured to, triggered by a first-type edge of a clock signal, push current of the first current source to the first output and pull current of the second current source from the second output, and, triggered by a following second-type edge of the clock signal, push current of the first current source to the second output and pull current of the second current source from the first output.

In some embodiments, the plurality of switch branches is a first plurality of switch branches. The DAC comprises a second plurality of switch branches comprising dump nodes and configured to steer current to the dump nodes when the first plurality of switch branches would push current to the first and second outputs.

In some embodiments, the plurality of switch branches comprise a first switch branch driven by a first signal. The first switch branch comprises first and second switches and is configured to, triggered by the first-type edge of the clock signal, push current to or pull current from the first output based on the first signal.

In some embodiments, the first switch is coupled between the first current source and the second switch. The second switch is coupled between the first switch and the second current source. The first output is between the first switch and the second switch.

In some embodiments, the plurality of switch branches comprise a second switch branch driven by the first signal. The first signal is coupled to the second switch branch through a latch. The second switch branch comprises third and fourth switches and is configured to, triggered by the second-type edge of the clock signal, push current to or pull current from the first output based on the first signal.

In some embodiments, the plurality of switch branches comprise a third switch branch driven by a second signal. The second signal is an inverted version of the first signal.

The third switch branch comprises fifth and sixth switches and is configured to, triggered by the first-type edge of the clock signal, push current to or pull current from the second output based on the second signal.

In some embodiments, the fifth switch is coupled between the first current source and the sixth switch. The sixth switch is coupled between the fifth switch the second current source. The second output is between the fifth switch and the sixth switch.

In some embodiments, the plurality of switch branches comprise a fourth switch branch driven by the second signal. The fourth switch branch comprises seventh and eighth switches and is configured to, triggered by the second-type edge of the clock signal, push current to or pull current from the second output based on the second signal.

In some embodiments, the plurality of switch branches is a first plurality of switch branches. The DAC comprises a second plurality of switch branches. The second plurality of switch branches comprise a fifth switch branch driven by a third signal. The fifth switch branch is configured to, triggered by the first-type clock edge, throw current away based on the third signal.

In some embodiments, the third signal is a result of an XOR operation of the first signal and the second signal.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Described herein are apparatus and methods for converting a digital signal to an analog signal at high frequencies, for example, at least 1 GHz or 2 GHz or 7 GHz or 9 GHz. The inventors have recognized and appreciated that digital-to-analog converters (DACs) operating at a high frequency are subject to higher distortion caused by, for example, code-dependent glitching, and higher power consumption, which may increase linearly with a clock frequency. The inventors have recognized and appreciated apparatus and methods that enable DACs to operate at high frequency with linear output, low distortion, low power consumption, and input data independence.

In some embodiments, a DAC may operate in a current steering mode, which is configured to convert a digital signal received by the DAC into a current that is an analog representation of the digital input signal. In some embodiments, the DAC may operate in a bi-polar quad or hex switching scheme, which is configured to, triggered by every edge of a clock signal, push current towards a positive output node and pull current from a negative output node, or push current towards the negative output node and pull current from the positive output node, in accordance with the digital signal received by the DAC. In some embodiments, the digital signal received by the DAC may be decoded into multiple formats including, for example, a dual-level format and a tri-level format.

In some embodiments, when the received digital signal is decoded into a dual-level format, the DAC may be configured to, triggered by an edge of the clock signal, steer current either from the positive output node to the negative output node or from the negative output node to the positive output node. In some embodiments, when the received digital signal is decoded into a tri-level format, the DAC may be configured to, triggered by an edge of the clock signal, steer current to the positive output node or the negative output node, or dump current to a dump node, which may be driven by an amplifier.

In some embodiments, a DAC may include switch drivers and output switches driven by the switch drivers. In some embodiments, switch drivers may include positive feedback circuitries, which solve a floating node problem that causes a memory effect and introduces distortion, and achieve low latency by forcing latches of the switch drivers to make fast decisions (e.g., within 100 ps). In some embodiments, when the received digital signal is decoded into a tri-level format, switch drivers may reduce latency by integrating XOR gates into latches of the switch drivers. In some embodiments, output switches may be configured to toggle every clock edge for low noise and push current to and pull current from the DAC's outputs. In some embodiments, when the received digital signal is decoded into a tri-level format, additional output switches may be configured to dump current to a dump node, which reduces noise.

Figure 1:
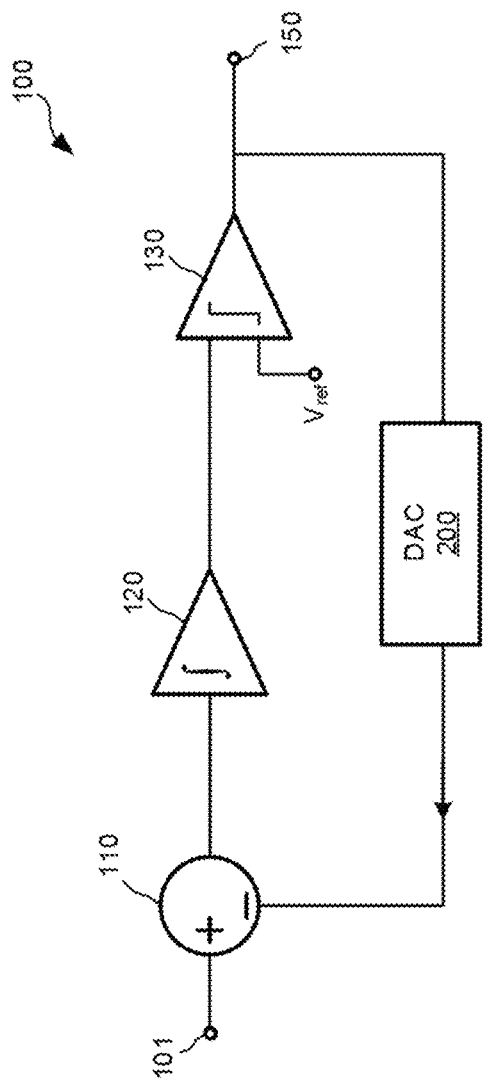
FIG. 1 is a simplified schematic diagram of a delta-sigma analog-to-digital converter (ADC) including a feedback digital-to-analog converter (DAC), according to some embodiments.

One or more DACs may be used in a system for converting digital signals into analog signals. FIG. 1 depicts an example of such a system 100. In the illustrated example, the system 100 is a delta-sigma analog-to-digital converter (ADC). The delta-sigma ADC 100 may be configured to receive an analog signal at an input 101 and output a stream of digital pulses at an output 150. The delta-sigma ADC 100 may operate as a continuous-time ADC, in some implementations. The delta-sigma ADC 100 may include a summing node 110, and integrator 120, a comparator 130, and a feedback loop having a DAC 200. A portion of the output 150 from the comparator 130 is fed back through the DAC 200 and converted from a digital signal to an analog signal at the DAC 200. The analog signal from the DAC 200 is provided to the summing node 110 and is added to the input signal. A pulse stream from the comparator 130 may be provided to the output 150 and sent to a counter (not shown). The counter may count the number of pulses during a sampling time interval to determine a digital signal level that corresponds to the sampled analog signal level received at the input 101.

The illustrated example is for instructional purposes only, and is not intended to limit the structure of a system to the illustrated delta-signal ADC. In some embodiments, a system may be a direct RF sampling delta-sigma ADC configured to operate without an external bandpass filter, which may be enabled by one or more high-speed DACs in accordance with some embodiments.

Figure 2:
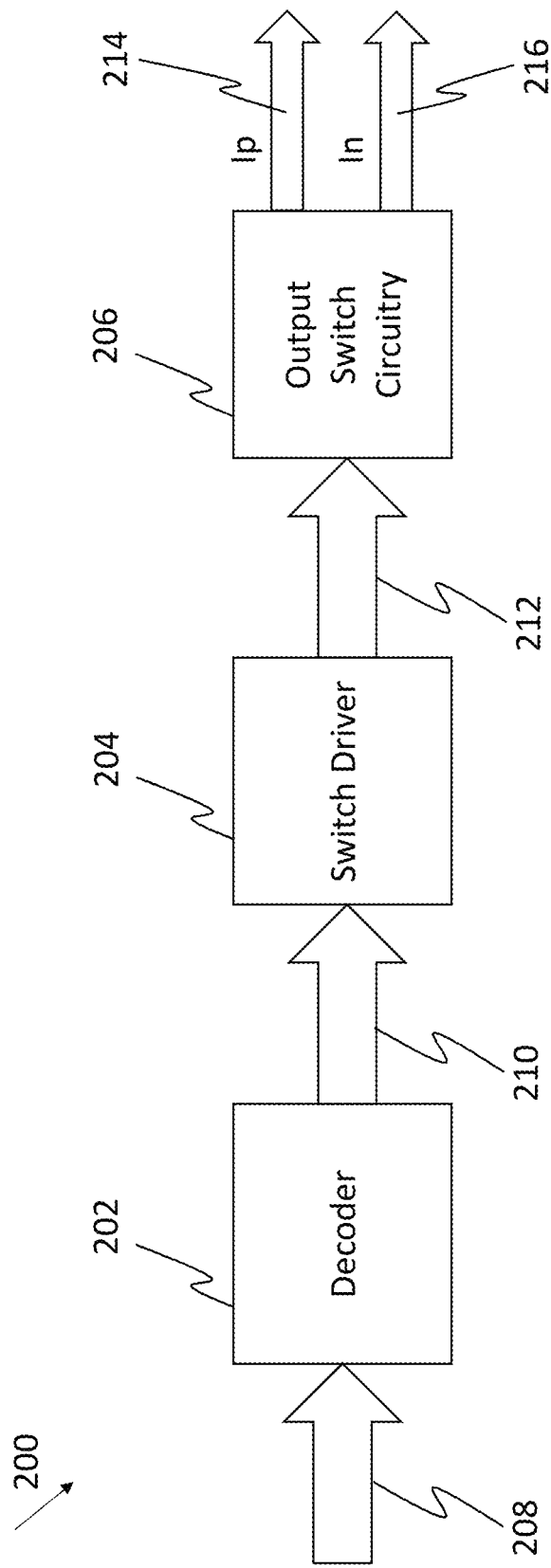
FIG. 2 is a simplified block diagram of a DAC, according to some embodiments.

FIG. 2 depicts a simplified block diagram of the DAC 200, according to some embodiments. The DAC 200 may include a decoder 202, switch driver 204, and output switch circuitry 206. The DAC 200 may be configured to receive a coded digital signal 208, for example, the stream of digital pulses at the output 150 (FIG. 1). The decoder 202 may convert the coded digital signal 208 to a decoded signal 210 in another format including, for example, a dual-level format and a tri-level format.

Table I illustrates an exemplary relationship between the coded input signal 208 and the decoded signal 210 in a dual-level format. In the illustrated examples, the input signal is a 16-bit thermometer coded signal S <15:0>. A dual-level decoder converts the 16-bit thermometer coded signal S <15:0> into two 16-bit thermometer coded signals P <15:0> and N <15:0>. The first 16-bit thermometer coded signal P <15:0> is configured to be the same as the 16 bit thermometer coded signal S <15:0>. The second 16-bit thermometer coded signal N <15:0> is configured to be an inverted version of the first 16-bit thermometer coded signal P <15:0>, which may invert each bit of the first 16-bit thermometer coded signal P <15:0> and reverse the sequence of the inverted bits. The bit inversion and order shuffling may be performed in any suitable order.

Table II illustrates an exemplary relationship between the coded input signal 208 and the decoded signal 210 in a tri-level format. In the illustrated examples, a tri-level decoder converts the 16-bit thermometer coded signal S <15:0> into three 8-bit thermometer coded signals P <7:0>, N <7:0>, and D <7:0>. The first 8-bit thermometer coded signal P <7:0> is configured to be the upper 8 bits of the 16-bit thermometer coded signal S <15:0>. The second 8-bit thermometer coded signal N <7:0> is configured to be an inverted version of the lower 8 bits of the 16-bit thermometer coded signal S <15:0>, which may invert each bit of the lower 8 bits of the 16-bit thermometer coded signal S <15:0> and reverse the sequence of the inverted bits. The bit inversion and order shuffling may be performed in any suitable order. The third 8-bit thermometer coded signal D <7:0> is configured to be results of XOR operations of N <7:0> and P <0:7>.

It should be appreciated that any suitable decoders may be used to convert the coded input signal 208 into any suitable formats. The decoding may include logic operations including, for example, XOR operations and NOT operations, performed in any suitable order.

TABLE I

Exemplary relationship between coded input signal to a DAC decoder and resulting decoded signal in a dual-level format to the switch drivers, according to some embodiments.

| Input Signal S<15:0> | P<15:0> | N<15:0> |
| --- | --- | --- |
| 1111 1111 1111 1111 | 1111 1111 1111 1111 | 0000 0000 0000 0000 |
| 0111 1111 1111 1111 | 0111 1111 1111 1111 | 0000 0000 0000 0001 |
| 0011 1111 1111 1111 | 0011 1111 1111 1111 | 0000 0000 0000 0011 |
| 0001 1111 1111 1111 | 0001 1111 1111 1111 | 0000 0000 0000 0111 |
| 0000 1111 1111 1111 | 0000 1111 1111 1111 | 0000 0000 0000 1111 |
| 0000 0111 1111 1111 | 0000 0111 1111 1111 | 0000 0000 0001 1111 |
| 0000 0011 1111 1111 | 0000 0011 1111 1111 | 0000 0000 0011 1111 |
| 0000 0001 1111 1111 | 0000 0001 1111 1111 | 0000 0000 0111 1111 |
| 0000 0000 1111 1111 | 0000 0000 1111 1111 | 0000 0000 1111 1111 |
| 0000 0000 0111 1111 | 0000 0000 0111 1111 | 0000 0001 1111 1111 |
| 0000 0000 0011 1111 | 0000 0000 0011 1111 | 0000 0011 1111 1111 |
| 0000 0000 0001 1111 | 0000 0000 0001 1111 | 0000 0111 1111 1111 |
| 0000 0000 0000 1111 | 0000 0000 0000 1111 | 0000 1111 1111 1111 |
| 0000 0000 0000 0111 | 0000 0000 0000 0111 | 0001 1111 1111 1111 |
| 0000 0000 0000 0011 | 0000 0000 0000 0011 | 0011 1111 1111 1111 |
| 0000 0000 0000 0001 | 0000 0000 0000 0001 | 0111 1111 1111 1111 |
| 0000 0000 0000 0000 | 0000 0000 0000 0000 | 1111 1111 1111 1111 |

TABLE II

Exemplary relationship between coded input signal to a DAC decoder and resulting decoded signal in a tri-level format to the switch drivers, according to some embodiments.

| Input Signal<15:0> | P<7:0> | N<7:0> | D<7:0> |
| --- | --- | --- | --- |
| 1111 1111 1111 1111 | 1111 1111 | 0000 0000 | 0000 0000 |
| 0111 1111 1111 1111 | 0111 1111 | 0000 0000 | 0000 0001 |
| 0011 1111 1111 1111 | 0011 1111 | 0000 0000 | 0000 0011 |
| 0001 1111 1111 1111 | 0001 1111 | 0000 0000 | 0000 0111 |
| 0000 1111 1111 1111 | 0000 1111 | 0000 0000 | 0000 1111 |
| 0000 0111 1111 1111 | 0000 0111 | 0000 0000 | 0001 1111 |
| 0000 0011 1111 1111 | 0000 0011 | 0000 0000 | 0011 1111 |
| 0000 0001 1111 1111 | 0000 0001 | 0000 0000 | 0111 1111 |
| 0000 0000 1111 1111 | 0000 0000 | 0000 0000 | 1111 1111 |
| 0000 0000 0111 1111 | 0000 0000 | 0000 0001 | 0111 1111 |
| 0000 0000 0011 1111 | 0000 0000 | 0000 0011 | 0011 1111 |
| 0000 0000 0001 1111 | 0000 0000 | 0000 0111 | 0001 1111 |
| 0000 0000 0000 1111 | 0000 0000 | 0000 1111 | 0000 1111 |
| 0000 0000 0000 0111 | 0000 0000 | 0001 1111 | 0000 0111 |
| 0000 0000 0000 0011 | 0000 0000 | 0011 1111 | 0000 0011 |
| 0000 0000 0000 0001 | 0000 0000 | 0111 1111 | 0000 0001 |
| 0000 0000 0000 0000 | 0000 0000 | 1111 1111 | 0000 0000 |

Referring back to FIG. 2, the switch driver 204 may modify the decoded signal 210 into driving signals 212 for the output switch circuitry 206. In some embodiments, the switch driver 204 may receive the decoded signal 210 as multiple separate parts in accordance with its format, for example, two separate parts of P <15:0> and N <15:0> of Table I. In some embodiments, the switch driver 204 may separate the decoded signal 210 in accordance with its format. When the decoded signal 210 is in a dual-level format, the switch driver may separate the decoded signal into two separate driving signals, for example, P <15:0> and N <15:0> of Table I. When the decoded signal 210 is in a tri-level format, the switch driver may separate the decoded signal into three separate driving signals, for example, P <7:0>, N <7:0>, and D <7:0> of Table II. In some embodiments, the decoded signal 210 received by the switch driver 204 may be partially decoded, for example, including P <7:0> and N <7:0> but not D <7:0>. The switch driver 204 may compute D <7:0> based on P <7:0> and N <7:0>.

In some embodiments, the switch driver 204 may store the separated driving signals for different times such that the driving signals 212 output at timings in accordance with a desired output mode of the output switch circuitry 206 including, for example, non return-to-zero mode (NRZ), return-to-zero mode (RZ), return-to-complement mode (RTC or RFZ or mixed mode or RF mode), and multiple return-to-zero mode (MRZ). In some embodiments, the switch driver 204 may regulate the separated driving signals to different voltage levels such that switches of the output switch circuitry operate in a desired status, for example, a switch in the form of a PMOS or NMOS transistor operating in a saturation region.

The output switch circuitry 206 may convert the driving signals 212 to a quantized analog output proportional to the coded input signal 208. In the illustrated example, the output switch circuitry 206 converts the driving signals 212 into binary or thermometer weighted currents Ip and In. The output switch circuitry 206 may be configured to steer current to a positive output node 214 and a negative output node 216 based on the driving signals 212. Additionally or alternatively, the output switch circuitry 206 may convert the driving signals 212 into binary or thermometer weighted voltages.

Figure 3A:
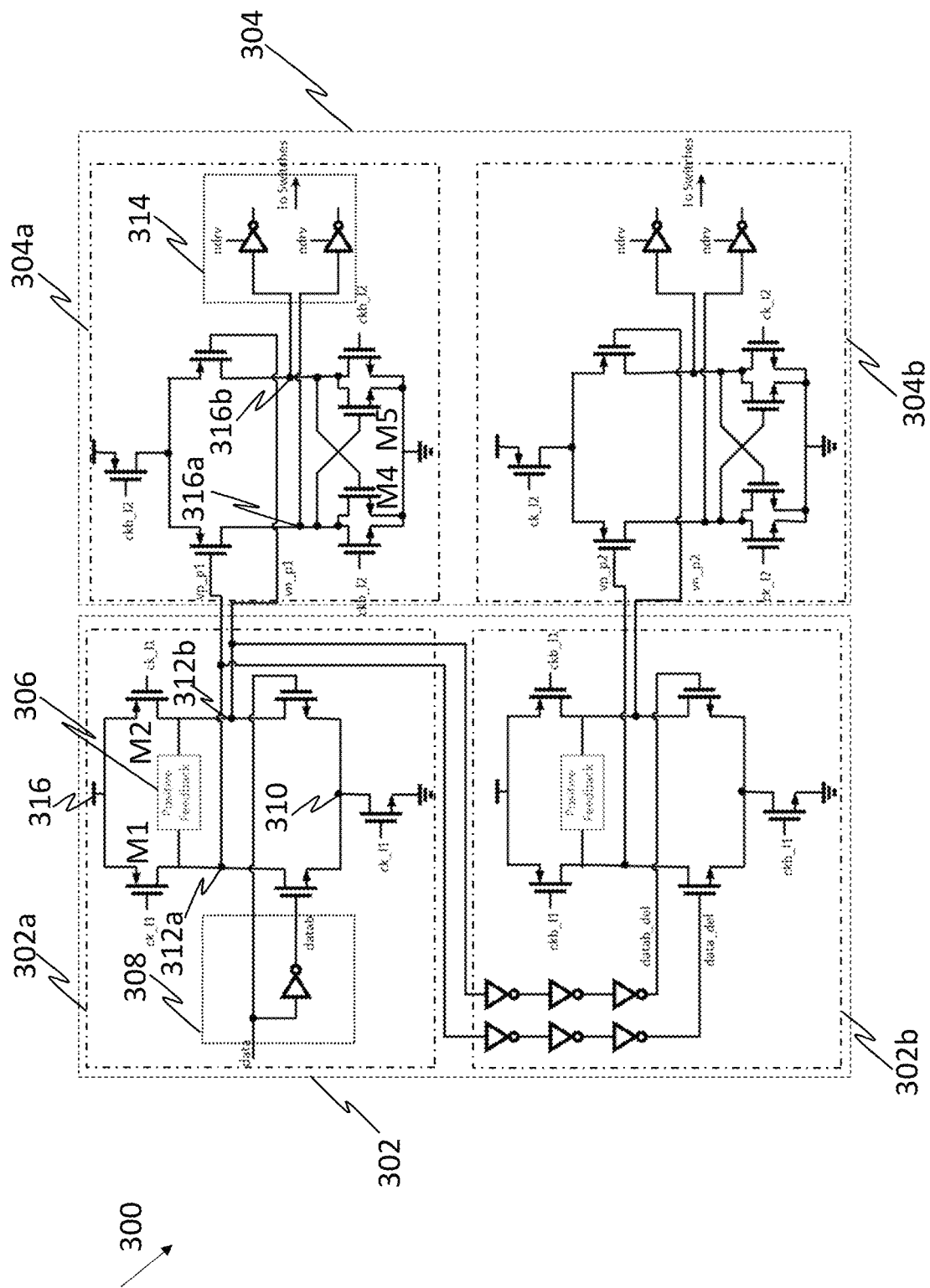
FIG. 3A is a schematic diagram of an exemplary dual-level switch driver, according to some embodiments.

FIG. 3A depicts an exemplary dual-level switch driver 300. The dual-level switch driver 300 may include first and second latches 302 and 304 connected in series. Such configuration with two latches may create a clean handoff with output switches of a DAC driven by the switch driver. Both the first and second latches 302 and 304 may use dynamic logic to enhance data independency. In some embodiments, the first latch 302 may receive a clock signal ck_l1. The second latch 304 may receive a clock signal ck_l2, which may be a delayed version of the clock signal ck_l1. For example, the clock signal ck_l2 may be the clock signal ck_l1 with a 20 ps delay.

The first latch 302 may receive an input data. In some embodiments, the input data may be the signal 210, which may be decoded or partially decoded. In some embodiments, the input data may be the coded input signal 208. The first latch 302 may include an internal decoder 308 configured to decode the input data. The second latch 304 may be configured with inverted polarity compared to the first latch 302 such that the second latch 304 may include an inverter level shift. In the illustrated example, the first latch 302 includes n-type transistors (e.g., NMOS) configured to receive the input data. The second latch 304 includes p-type transistors (e.g., PMOS) configured to receive outputs of the first latch 302.

The first latch 302 may include first and second parts 302a and 302b. The first part 302a may receive the clock signal ck_l1. The first part 302a may be configured to output a pair of driving signals vp_p1 and vn_p1 at output nodes 312a and 312b, respectively. The second part 302b may be configured to output a pair of driving signals vp_p2 and vn_p2, based on the pair of driving signals vp_p1 and vn_p1. The second part 302b may receive a clock signal ckb_l1, which may be an inverted version of the clock signal ck_l1, such that the output of the pair of driving signals vp_p2 and vn_p2 is triggered by a falling edge of the clock signal ck_l1, while the output of the pair of driving signals vp_p1 and vn_p1 is triggered by a rising edge of the clock signal ck_l1.

Figure 3B:
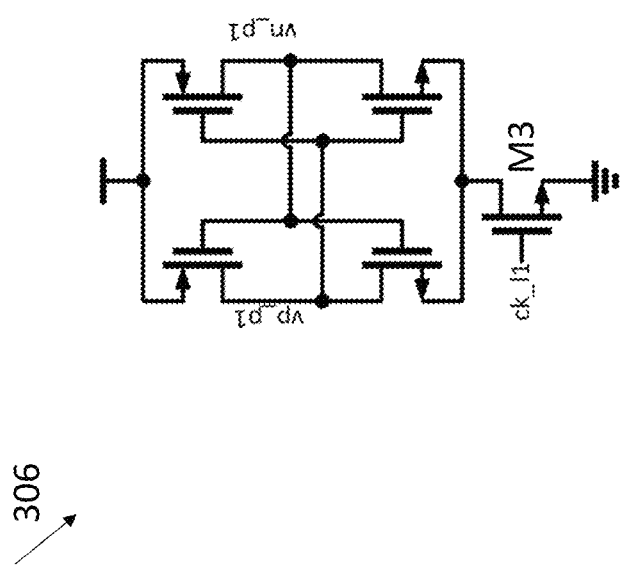
FIG. 3B is a schematic diagram of an exemplary positive feedback circuitry of the switch driver of FIG. 3A, according to some embodiments.

The first latch 302 may include a positive feedback circuitry 306 coupled to the output nodes 312a and 312b. FIG. 3B depicts an exemplary positive feedback circuitry 306. The positive feedback circuitry 306 may be configured to invert the driving signal vp_p1 and send the inverted signal to the output node 312b. The positive feedback circuitry 306 may receive the clock signal ck_l1 such that the first latch can be reset by pulling both output nodes 312a and 312b to the supply voltage 316, for example, when the clock signal ck_l1 is low and p-type transistors M1 and M2 are turned on. In the illustrated example, the positive feedback circuitry 306 receives the clock signal ck_l1 at the gate of an n-type transistor M3 such that the positive feedback circuitry 306 does not burn current during the reset of the first latch.

The inventors have recognized and appreciated that the positive feedback circuitry 306 can initiate during a decision phase of the first latch 302 and encourage a decision made by the first latch 302 fast, for example, within 100 ps. The inventors have recognized and appreciated that the positive feedback circuitry 306 can solve a floating node problem of the output nodes 312a and 312b. When the first latch is not being reset, without the positive feedback circuitry 306, at least one of the output nodes 312a and 312b will float, which causes memory effect and introduces distortion. The positive feedback circuitry 306 removes the floating node problem of the output nodes 312a and 312b. Further, the inventors have recognized and appreciated that the positive feedback circuitry 306 improves data independency of the switch driver 300. If the input data changes when the clock signal ck_l1 is low, without the positive feedback circuitry 306, the outputs will transit due to metastability. The positive feedback circuitry 306 adds positive feedback to create hysteresis.

The second latch 304 may include first and second parts 304a and 304b. The first part 304a of the second latch 304 may receive the pair of driving signals vp_p1 and vn_p1 of the first part 302a of the first latch 302. The first part 304a of the second latch 304 may be configured to delay the pair of driving signals vp_p1 and vn_p1 for a predetermined time, for example, 20 ps. The first part 304a of the second latch 304 may invert the pair of driving signals vp_p1 and vn_p1 and output the inverted signal pair at nodes 316a and 316b, which may be cross-coupled through transistors M4 and M5. The first part 304a of the second latch 304 may include an inverter level shift circuitry 314, which may be configured to shift the voltage level of the pair of driving signals vp_p1 and vn_p1 such that output switches driven by the pair of driving signals vp_p1 and vn_p1 operate in saturation regions over respective output switches' threshold voltages. Similarly, the second part 304b of the second latch 304 may output a delayed, level-shifted version of the pair of driving signals vp_p2 and vn_p2 of the second part 302b of the first latch 302.

Figure 4A:
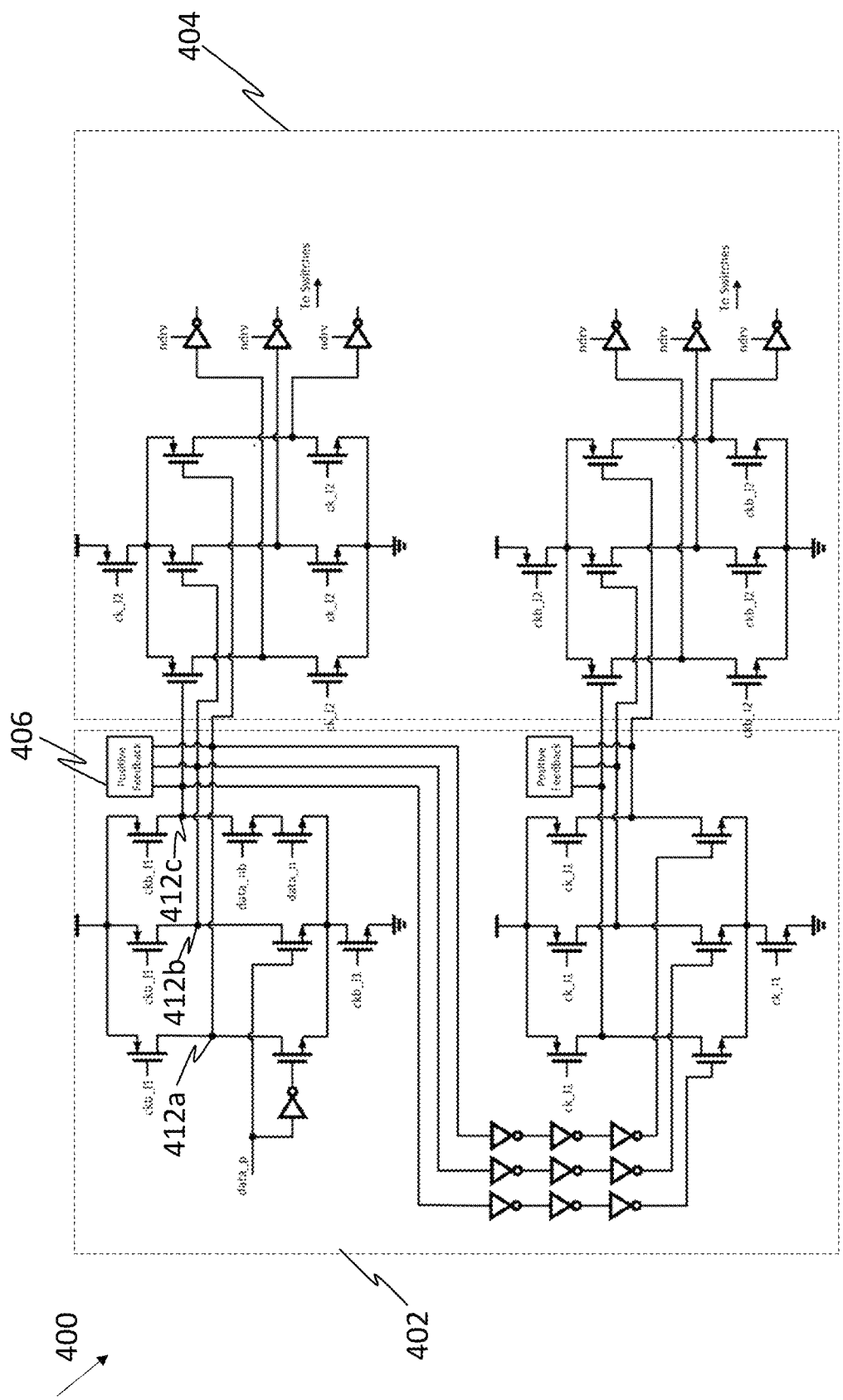
FIG. 4A is a schematic diagram of an exemplary tri-level switch driver, according to some embodiments.
Figure 4B:
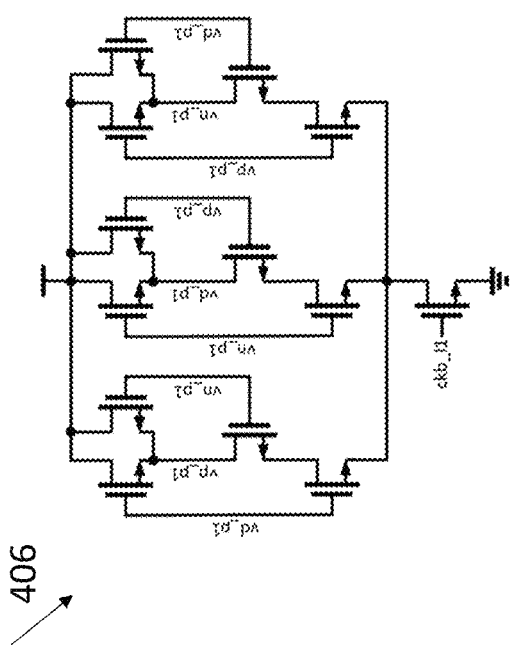
FIG. 4B is a schematic diagram of an exemplary positive feedback circuitry of the switch driver of FIG. 4A, according to some embodiments.
Figure 4C:
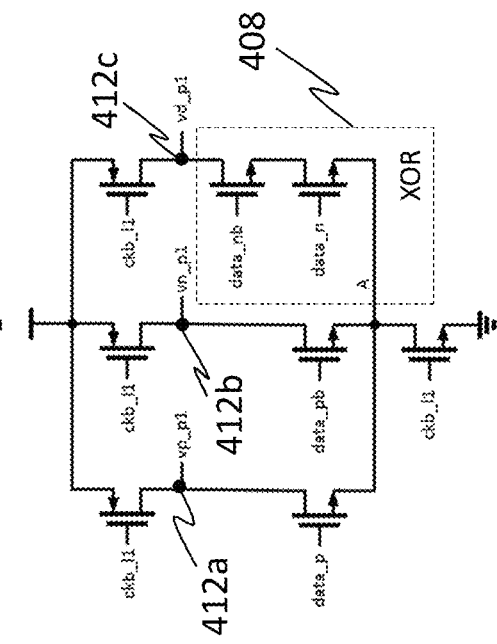
FIG. 4C is a schematic diagram of a portion of the switch driver of FIG. 4A, illustrating output signals of the portion, according to some embodiments.

FIG. 4A depicts an exemplary tri-level switch driver 400, a portion of which is depicted in FIG. 4C to show output signals of the portion. Similar to the dual-level switch driver 300, the tri-level switch driver 400 may include first and second latches 402 and 404 connected in series. It should be appreciated although not shown in the illustrated example, the second latch 404 may include additional transistors such that the outputs of the second latch 404 are cross-coupled.

In some embodiments, the first latch 402 may receive inputs data_p, data_n, and data_nb. The input data_p may correspond to P <7:0> of Table II although the number of bits may be the same or different. The input data_n may correspond to N <7:0> of Table II although the number of bits may be the same or different. The input data_nb, which may be an inverted version of the input data_n. The first latch 402 may include an XOR gate 408, which may be configured to compute an XOR operation of the input data_n and the input data_nb. The computed driving signal vd_p1 may correspond to D <7:0> of Table II although the number of bits may be the same or different. Such configuration of integrating the XOR gate into the first latch reduces latency and power consumption of the tri-level switch driver 400.

Unlike the first latch 302 of the dual-level switch driver 300, which is configured to output the pair of driving signals vp_p1 and vn_p1 at output nodes 312a and 312b, respectively, the first latch 402 of the tri-level switch driver 400 is configured to output three driving signals vp_p1, vn_p1, and vd_p1 at output nodes 412a, 412b, and 412c, respectively. It should be appreciated that the pair of driving signals vp_p1 and vn_p1 at output nodes 312a and 312b may be in a dual-level format, which may have the relationship as P <15:0> and N <15:0> illustrated in Table I although the number of bits of vp_p1 and vn_p1 may depend on the number of bits of the corresponding input data. On the other hand, the three driving signals vp_p1, vn_p1, and vd_p1 at output nodes 412a, 412b, and 412c may be in a tri-level format, which may have the relationship as P <7:0> and N <7:0> and D<7:0> illustrated in Table II although the number of bits of vp_p1, vn_p1, and vd_p1 may depend on the number of bits of the corresponding input data.

The switch driver 400 may include a positive feedback circuitry 406 coupled to the output nodes 412a, 412b, and 412c. FIG. 4B depicts an exemplary positive feedback circuitry 406. The positive feedback circuitry 406 may be configured to compute a NAND operation of the driving signal vn_p1 and vd_p1 and send the computed signal to the output node 412a. The positive feedback circuitry 406 may be configured to compute a NAND operation of the driving signal vp_p1 and vd_p1 and send the computed signal to the output node 412b. The positive feedback circuitry 406 may be configured to compute a NAND operation of the driving signal vp_p1 and vd_n1 and send the computed signal to the output node 412c. Similar to the positive feedback circuitry 306, the positive feedback circuitry 406 may receive a clock signal ck_l1 such that the first latch 402 can be reset.

The inventors have recognized and appreciated that, like the positive feedback circuitry 306, the positive feedback circuitry 406 can initiate during a decision phase of the first latch 402 and encourage a decision made by the first latch 402 fast, for example, within 100 ps. The inventors have recognized and appreciated that the positive feedback circuitry 406 can solve a floating node problem of the output nodes 412a, 412b, and 412c. Further, the inventors have recognized and appreciated that the positive feedback circuitry 406 improves data independency of the switch driver 400.

The inventors have recognized and appreciated output switch circuitry configurations that enable operating a output switch circuitry to reconstruct received driving signals using Nyquist zones other than a first Nyquist zone. Nyquist zones may define a band of frequencies that is one half of a sampling frequency wide (e.g., the frequency of a clock signal received by a DAC). A first Nyquist zone may extend from 0 Hz to half of the sampling frequency. A second Nyquist zone may extend from half of the sample frequency to the sampling frequency, and so on.

Figure 5:
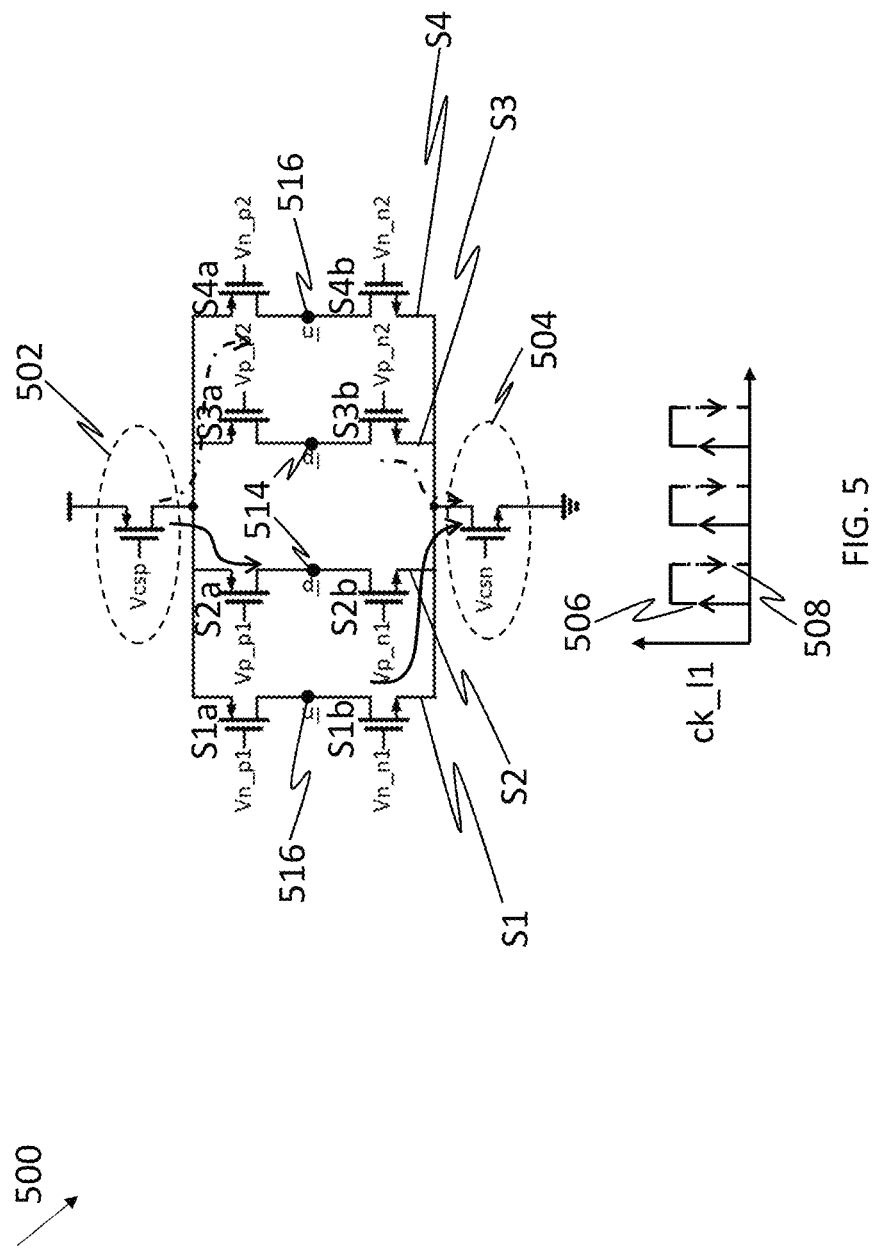
FIG. 5 is a schematic diagram of an exemplary dual-level output switch circuitry, illustrating exemplary current flow directions triggered by rising edges and falling edges of a clock signal, respectively, according to some embodiments.

FIG. 5 depicts an exemplary dual-level output switch circuitry 500 capable of using higher Nyquist zones. The output switch circuitry 500 may receive driving signals from a dual-level switch driver, for example, driving signals vp_p1, vn_p1, vp_p2, and vn_p2 of the dual-level switch driver 300. The dual-level switch driver may be a p-type switch driver. In the illustrated example, the output switch circuitry 500 also receives driving signals vp_n1, vn_n1, vp_n2, and vn_n2, which may be from another dual-level switch driver that is an n-type switch driver. An n-type switch driver may be constructed in an inverted polarity compared to a p-type switch driver. The output switch circuitry 500 may be configured to steer current to a positive output node 514 and a negative output node 516 based on the received driving signals, and convert the received driving signals into binary or thermometer weighted currents Ip and In.

The output switch circuitry 500 may include current sources 502 and 504. The current source 502 may be configured to push current to the output nodes 514 and 516. The current source 504 may be configured to pull current from the output nodes 514 and 516. In the illustrated example, the current source 502 includes a p-type transistor coupled to a voltage supply and controlled by a gate signal Vcsp. The current source 504 includes an n-type transistor coupled to a reference voltage level (e.g., ground) and controlled by a gate signal Vcsn. It should be appreciated that the current sources 502 and 504 may have any suitable architecture.

The output switch circuitry 500 may include switch branches S1-S4, coupled between the current sources 502 and 504. Each switch branch may include a p-type transistor (e.g., S1a-S4a) and an n-type transistor (e.g., S1b-S4b) connected in series. In the illustrated example, branches S1 and S2 are configured to be triggered by rising edges 506 of a clock signal ck_l1. The branch S1 is configured to push current to or pull current from the output 516 based on the driving signals vn_p1 and vn_n1. The branch S2 is configured to push current to or pull current from the output 514 based on the driving signal vp_p1 and vp_n1. Branches S3 and S4 are configured to be triggered by falling edges 508 of a clock signal ck_l1. The branch S3 is configured to push current to or pull current from the output 514 based on the driving signal vp_p2 and vp_n2. The branch S4 is configured to push current to or pull current from the output 516 based on the driving signal vn_p2 and vn_n2.

The switch branches S1-S4 may be configured to, triggered by a rising edge of the clock signal ck_l1, push current of the current source 502 to one of the outputs 514 and 516 and pull current of the current source 504 from the other one of the outputs 514 and 516, depending on the driving signals vp_p1, vp_n1, vp_p1, vn_n1. The switch branches S1-S4 may be configured to, triggered by a following falling edge of the clock signal ck_l1, push current of the current source 502 to the other one of the outputs 514 and 516 and pull current of the current source 504 from the one of the outputs 514 and 516, depending on the driving signals vp_p2, vp_n2, vp_p2, vn_n2. In the illustrated example, triggered by a rising edge 506, the current source 502 pushes current to the output 514 through the switch S2a, and the current source 504 pulls current from the output 516 through the switch S1b. Triggered by a falling edge 508, immediately following the rising edge 506, the current source 502 pushes current to the output 516 through the switch S4a, and the current source 504 pulls current from the output 514 through the switch S3b.

Figure 6:
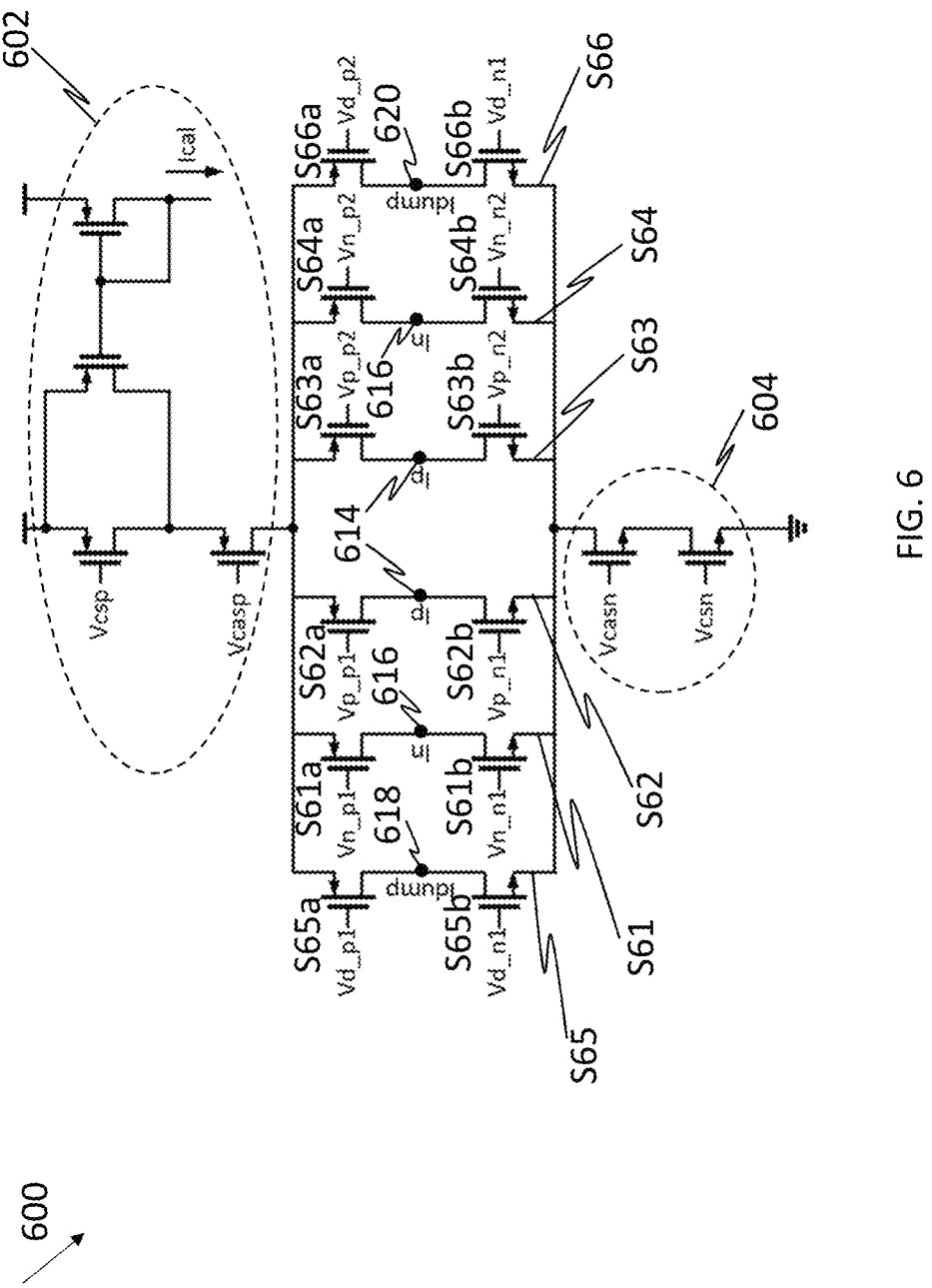
FIG. 6 is a schematic diagram of an exemplary tri-level output switch circuitry, according to some embodiments.

FIG. 6 depicts an exemplary tri-level output switch circuitry 600 capable of using higher Nyquist zones. The output switch circuitry 600 may receive driving signals from a tri-level switch driver, for example, driving signals vp_p1, vn_p1, vd_p1, vp_p2, vn_p2, and vd_p2 of the tri-level switch driver 600. The tri-level switch driver may be a p-type switch driver. In the illustrated example, the output switch circuitry 600 also receive driving signals vp_n1, vn_n1, vd_n1, vp_n2, vn_n2, and vd_n2, which may be from another tri-level switch driver that is an n-type switch driver. The output switch circuitry 600 may be configured to steer current to a positive output node 614 and a negative output node 616 based on the received driving signals, and convert the received driving signals into binary or thermometer weighted currents Ip and In.

The output switch circuitry 600 may include current sources 602 and 604. The current source 602 may be configured to push current to the output nodes 614 and 616. The current source 604 may be configured to pull current from the output nodes 614 and 616. The output switch circuitry 600 may include switch branches S61-S64, coupled between the current sources 602 and 604. Two of the switch branches, e.g., branches S61 and S62 may be configured to, triggered by rising edges of a clock signal, push current to one of the outputs 614 and 616 and pull current from the other one of the outputs 614 and 616. The other two of the switch branches, e.g., branches S63 and S64 may be configured to, triggered by falling edges of a clock signal, push current to one of the outputs 614 and 616 and pull current from the other one of the outputs 614 and 616.

The output switch circuitry 600 may include additional switch branches S65 and S66. The switch branch S65 may be configured to, triggered by rising edges of the clock signal, dump current to a dump node 618 when the switch branches S61 and S62 would push current into both outputs 614 and 616 based on corresponding driving signals, for example, vp_p1 and vn_p1 are low. The switch branch S66 may be configured to, triggered by falling edges of the clock signal, dump current to a dump node 620 when the switch branches S63 and S64 would push current into both outputs 614 and 616 based on corresponding driving signals, for example, vp_p2 and vn_p2 are low. The dump nodes may be alternate nodes that are not used as the DAC's outputs. The dump nodes may be driven by an amplifier such that its voltage is defined.

Various aspects of the apparatus and techniques described herein may be used alone, in combination, or in a variety of arrangements not specially discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

The terms "approximately", "substantially," and "about" may be used to mean within ±20% of a target value in some embodiments, within ±10% of a target value in some embodiments, within ±5% of a target value in some embodiments, and yet within ±2% of a target value in some embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A digital-to-analog converter (DAC) comprising:
first and second switches;
a current source configured to push current to a first output through the first switch based on a first signal and a second output through the second switch based on a second signal; and
a switch driver configured to receive a data signal and a clock signal, the switch driver comprising a latch and a positive feedback circuitry, the latch comprising a first output node for the first signal and a second output node for the second signal, the positive feedback circuitry configured to connect the first output node and the second output node.

2. The DAC of claim 1, wherein the positive feedback circuitry is configured to receive the clock signal such that the latch can be reset.

3. The DAC of claim 1, wherein the latch is configured to receive the data signal and the clock signal.

4. The DAC of claim 1, wherein:
the data signal comprises first and second portions, and
the latch comprises a third output node configured to output a result of an XOR operation of the first and second portions of the data signal.

5. The DAC of claim 1, wherein:
the latch is configured to receive an inverted version of the clock signal, and
the latch comprises two additional output nodes configured to output based on the inverted version of the clock signal and the first and second signals.

6. The DAC of claim 1, wherein the switch driver comprises a level shift circuitry configured to shift the voltage levels of the first and second signals such that the first and second switches operate in saturation region.

7. The DAC of claim 1, wherein:
the latch is a first latch, and
the switch driver comprises a second latch between the first latch and the first and second switches.

8. The DAC of claim 7, wherein the second latch comprises output nodes that are cross-coupled.

9. The DAC of claim 7, wherein:
the clock signal is a first clock signal,
the second latch is configured to receive a second clock signal, and
the second clock signal is a delayed version of the first clock signal.

10. The DAC of claim 9, wherein:
the first latch comprises transistors of a first-type configured to receive the data signal, and
the second latch comprises transistors of a second-type configured to receive the first signal and the second signal.

11. A digital-to-analog converter (DAC) comprising:
a first current source configured to push current to first and second outputs;
a second current source configured to pull current from the first and second outputs; and
a plurality of switch branches configured to, triggered by a first-type edge of a clock signal, push current of the first current source to the first output and pull current of the second current source from the second output, and, triggered by a following second-type edge of the clock signal, push current of the first current source to the second output and pull current of the second current source from the first output.

12. The DAC of claim 11, wherein:
the plurality of switch branches is a first plurality of switch branches, and
the DAC comprises a second plurality of switch branches comprising dump nodes and configured to steer current to the dump nodes when the first plurality of switch branches would push current to the first and second outputs.

13. The DAC of claim 11, wherein:
the plurality of switch branches comprise a first switch branch driven by a first signal, and
the first switch branch comprises first and second switches and is configured to, triggered by the first-type edge of the clock signal, push current to or pull current from the first output based on the first signal.

14. The DAC of claim 13, wherein:
the first switch is coupled between the first current source and the second switch,
the second switch is coupled between the first switch and the second current source, and
the first output is between the first switch and the second switch.

15. The DAC of claim 13, wherein:
the plurality of switch branches comprise a second switch branch driven by the first signal,
the first signal is coupled to the second switch branch through a latch, and
the second switch branch comprises third and fourth switches and is configured to, triggered by the second-type edge of the clock signal, push current to or pull current from the first output based on the first signal.

16. The DAC of claim 15, wherein:
the plurality of switch branches comprise a third switch branch driven by a second signal,
the second signal is an inverted version of the first signal, and
the third switch branch comprises fifth and sixth switches and is configured to, triggered by the first-type edge of the clock signal, push current to or pull current from the second output based on the second signal.

17. The DAC of claim 16, wherein:
the fifth switch is coupled between the first current source and the sixth switch,
the sixth switch is coupled between the fifth switch the second current source, and
the second output is between the fifth switch and the sixth switch.

18. The DAC of claim 16, wherein:
the plurality of switch branches comprise a fourth switch branch driven by the second signal, and
the fourth switch branch comprises seventh and eighth switches and is configured to, triggered by the second-type edge of the clock signal, push current to or pull current from the second output based on the second signal.

19. The DAC of claim 14, wherein:
the plurality of switch branches is a first plurality of switch branches,
the DAC comprises a second plurality of switch branches,
the second plurality of switch branches comprise a fifth switch branch driven by a third signal, and
the fifth switch branch is configured to, triggered by the first-type clock edge, throw current away based on the third signal.

20. The DAC of claim 19, wherein the third signal is a result of an XOR operation of the first signal and the second signal.

* * * * *